(12) United States Patent
Yamaguchi et al.

(10) Patent No.: US 7,653,098 B2
(45) Date of Patent: Jan. 26, 2010

(54) SEMICONDUCTOR LIGHT EMITTING DEVICE AND METHOD FOR MANUFACTURING THE SAME

(75) Inventors: Tsutomu Yamaguchi, Tokyo (JP); Yoshihisa Tashiro, Tokyo (JP); Kenzo Mori, Tokyo (JP); Hiroo Sakamoto, Tokyo (JP); Takehiro Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 49 days.

(21) Appl. No.: 12/165,674

(22) Filed: Jul. 1, 2008

(65) Prior Publication Data

US 2009/0135878 A1    May 28, 2009

(30) Foreign Application Priority Data

Nov. 26, 2007  (JP) .............................. 2007-304803

(51) Int. Cl.
*H01S 3/00* (2006.01)
*H01S 5/00* (2006.01)

(52) U.S. Cl. .................................. 372/33; 372/50.121

(58) Field of Classification Search .................... 372/33, 372/34, 36, 50.121
See application file for complete search history.

(56) References Cited

U.S. PATENT DOCUMENTS 6,867,796 B1    3/2005    Suzuki et al.

FOREIGN PATENT DOCUMENTS

| JP | 4-286177 A | 10/1992 |
|----|------------|---------|
| JP | 2001-156379 A | 6/2001 |
| JP | 2001-308438 A | 11/2001 |
| JP | 2007-157869 A | 6/2007 |

*Primary Examiner*—Armando Rodriguez
(74) *Attorney, Agent, or Firm*—Leydig, Voit & Mayer, Ltd.

(57) ABSTRACT

A semiconductor laser chip is joined to an AlN sub-mount in a junction-down manner. The sub-mount is joined to a package. The AlN sub-mount is joined to a stem. The direction perpendicular to the irradiation direction of a laser beam emitted from the semiconductor laser chip is the direction of the width of the sub-mount. The thickness and the width of the AlN sub-mount are determined so that the product of the equivalent stress applied to the center of the surface of the semiconductor laser chip joined to the sub-mount and the stress in the direction of the width of the sub-mount does not exceed 70% of the maximum value of the product obtained by changing the thickness and the width of the AlN sub-mount.

7 Claims, 7 Drawing Sheets

Rage of Σ corresponding to
range of polarization
angle required from yield

Range of polarization angle required from yield

SEMICONDUCTOR LIGHT EMITTING DEVICE AND METHOD FOR MANUFACTURING THE SAME

BACKGROUND OF THE INVENTION

1. Field of the Invention

The present invention relates to a semiconductor light emitting device formed by joining a semiconductor laser chip on a sub-mount in a junction-down manner, and more specifically to a semiconductor light emitting device that can reduce the polarizing angle of a laser, and a method for manufacturing such a semiconductor light emitting device.

2. Background Art

GaAs is used as a material of the substrate for a semiconductor laser, and Fe or highly heat-dissipating Cu is used as a material of the package for mounting the semiconductor laser. Here, the coefficient of linear expansion of GaAs is 6 ($\times 10^{-6}/°$ C.), the coefficient of linear expansion of Fe is 11 ($\times 10^{-6}/°$ C.), and the coefficient of linear expansion of Cu is 17 ($\times 10^{-6}/°$ C.). Therefore, when the semiconductor laser having a GaAs substrate is directly adhered to an Fe package with solder or the like, residual stress occurs due to difference in coefficients of linear expansion, and there is a case wherein the semiconductor laser is damaged. When a Cu package is used, the difference in coefficients of linear expansion becomes further significant, and residual stress becomes further significant.

Consequently, a sub-mount formed of AlN or the like is inserted between the package and the semiconductor laser. Here, AlN has a coefficient of linear expansion of 4 ($\times 10^{-6}/°$ C.), which is close to the coefficient of linear expansion of the GaAs substrate, and has a high mechanical strength. Therefore, by inserting the AlN sub-mount, the residual stress of the package is lowered.

However, even if the sub-mount is inserted, the residual stress applied to the semiconductor laser chip in the assembled state cannot be made zero. Therefore, conventionally, in order to lower the residual stress, the composition of solder used for joining or the material for the sub-mount was changed, the assembling conditions were adjusted, or the solder layer was thickened. Also in order to relax the stress in the vicinity of the light-emitting point, a structure wherein the laser chip is protruded from the sub-mount has been proposed (for example, refer to Patent Document 1).

[Patent Document 1] Japanese Patent Laid-Open No. 2001-156379

SUMMARY OF THE INVENTION

However, residual stress could not be sufficiently lowered in conventional semiconductor light emitting device. In the device according to Patent Document 1, since a sub-mount formed of Si was used, the residual stress was large compared with the case wherein a sub-mount formed of AlN was used. By the residual stress, strain was caused in semiconductor crystals in the waveguide where laser beams were propagated, and the polarizing angle of the laser was enlarged.

Here, in the optical system of an optical pickup, to improve the read accuracy of data recorded in a disk, a polarizing element is used, and the laser beams pass through the polarizing element to combine with the lens. Since the intensity of the laser beams that have passed through the polarizing element is lowered as the polarizing angle is larger, the polarizing angle must be small.

In the optical pickup, when the variation of the polarizing angle relative to change in the operating environment temperature of the semiconductor laser is larger, the combining efficiency of optical parts and laser beams is lowered, more optical output is required on data writing, and power consumption is increased. Therefore, the variation of the polarizing angle relative to change in the operating environment temperature must be small.

In conventional semiconductor light emitting devices, however, the polarizing angle of a laser was large due to the effect of residual stress, and the variation of the polarizing angle relative to change in the operating environment temperature was large. Therefore, there were problems wherein the yield in the test was poor, and the operation of the semiconductor laser was unstable.

Furthermore, in a laser wherein a plurality of semiconductor lasers having different wavelengths were monolithically integrated, such as two-wavelength laser formed by integrating a DVD laser and a CD laser, there was a problem wherein the polarizing angle could not be adjusted by one polarizing plate when the polarizing angles of respective lasers were different.

To solve the above-described problems, it is an object of the present invention to provide a semiconductor light emitting device that can reduce the polarizing angle of a laser, and a method for manufacturing such a semiconductor light emitting device.

According to one aspect of the present invention, a semiconductor light emitting device formed by joining a semiconductor laser chip on a sub-mount in a junction-down manner, and joining said sub-mount to a package, wherein the direction perpendicular to the irradiation direction of laser beams from said semiconductor laser chip is the width direction of said sub-mount, and the thickness and width of said sub-mount are determined so that the product of the equivalent stress to the center of the surface of said semiconductor laser chip joining said sub-mount and the stress in the width direction of said sub-mount is not exceeding 70% of the maximum value of said product obtained by changing the thickness and width of said sub-mount.

According to the present invention, the polarizing angle of a laser can be reduced.

Other and further objects, features and advantages of the invention will appear more fully from the following description.

DETAILED DESCRIPTION OF THE PREFERRED EMBODIMENTS

First Embodiment

Figure 1:
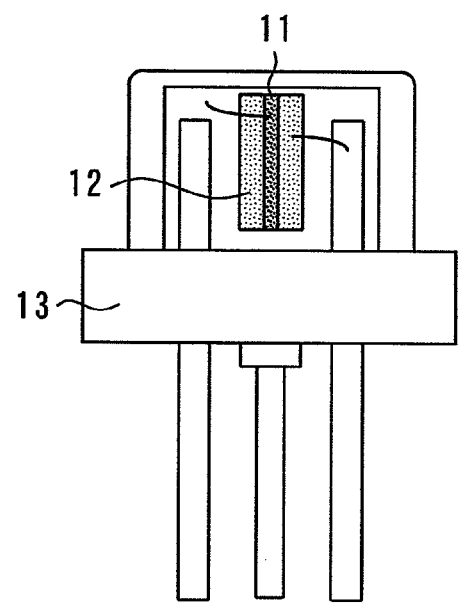
FIG. 1 is a plan view showing a semiconductor light emitting device according to the first embodiment.

FIG. 1 is a plan view showing a semiconductor light emitting device according to the first embodiment. The semiconductor light emitting device is a stem package formed by joining a semiconductor laser chip 11 on an AlN sub-mount 12 in a junction-down manner, and joining the AlN sub-mount 12 (sub-mount) to a Cu stem 13 (package). In place of the Cu stem 13, a stem formed of Fe may be used.

Figure 2:
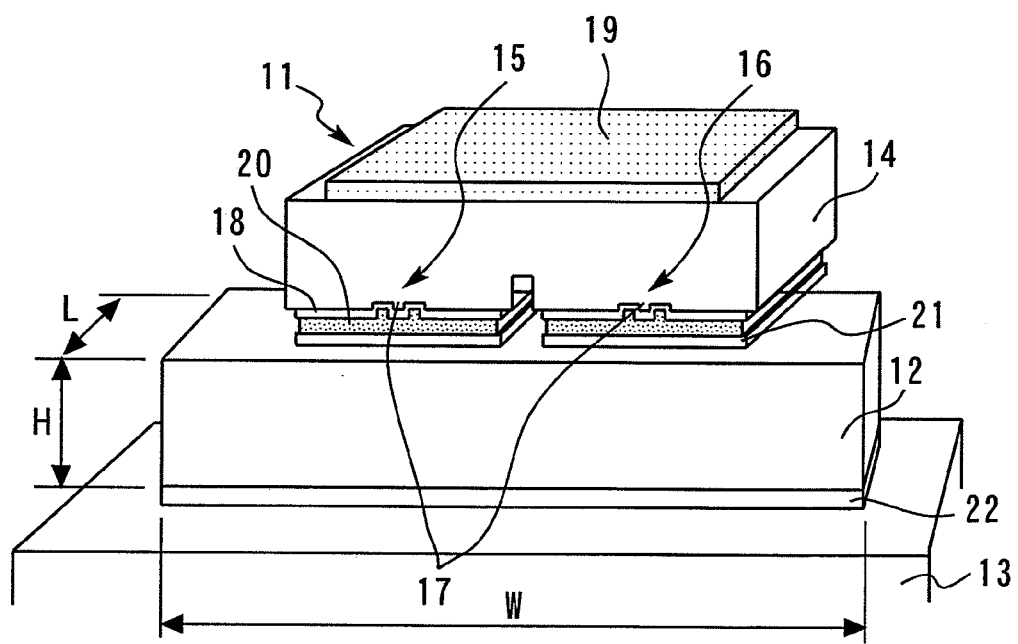
FIG. 2 is a perspective view showing joining portions of the semiconductor laser chip and the sub-mount in the semiconductor light emitting device according to the first embodiment.

FIG. 2 is a perspective view showing joining portions of the semiconductor laser chip and the sub-mount in the semiconductor light emitting device according to the first embodiment. The semiconductor laser chip 11 is a two-wavelength laser formed by integrating a ridge-type CD laser 15 and a ridge-type DVD laser 16 on a GaAs substrate 14. The ridge portions of the CD laser 15 and the DVD laser 16 are respective light-emitting points 17. A surface electrode 18 and a back-face electrode 19 are formed on the surface and the back-face of the semiconductor laser chip 11, respectively. An Au plating 20 is formed on the surface electrode 18. The semiconductor laser chip 11 is joined in a junction-down manner onto the AlN sub-mount 12 via a solder layer 21 of a thickness of 5 μm. The AlN sub-mount 12 is joined on the Cu stem 13 via an AuSn solder 22 of a thickness of 5 μm.

In the first embodiment, the thickness H of the AlN sub-mount 12 is adjusted to reduce the polarizing angle of the laser. A method for the adjustment will be described below in detail.

The present inventors found from thermal stress elasto-plastic analyses and experimental results that the polarizing angle of a laser is not simply reduced with the reduction of equivalent stress corresponding to residual stress, but depends on the value Σ defined in the following equation (1).

$$\Sigma = \text{Equivalent stress} \times \text{Stress in the direction of width W of sub-mount} \quad (1)$$

Here, the direction of the width W of the sub-mount is the direction perpendicular to the irradiation direction of the laser beams of a semiconductor laser chip. Both the equivalent stress and the stress in the direction of width W of sub-mount are stresses applied to the center of the plane where the semiconductor laser chip is joined to the sub-mount.

Next, the thermal stress elasto-plastic analysis will be described. Table 1 shows the results of calculations for the stress applied to the center of the plane where the semiconductor laser chip is joined to the sub-mount in a semiconductor light emitting device formed by joining a semiconductor laser chip on an AlN sub-mount in a junction-down manner via an AuSn solder layer of a thickness of 5 μm, and joining the sub-mount onto an Fe stem. In the case of a commonly used DVD laser, the center portion corresponds to the optical waveguide portion. Here, the shape of semiconductor laser chip is a rectangular parallelepiped formed of GaAs of 2200 μm L×150 μm W×100 μm H. However, the thickness of the semiconductor laser chip fluctuates by about ±10 μm due to the fluctuation of manufacturing conditions. The value with asterisk * is the value obtained by interpolating the values of sub-mount widths of 340 pin and 540 μm.

TABLE 1

| Item | Unit | Spec. 1 | Spec. 2 | Spec. 3 | Spec. 4 | Spec5 | Spec. 6 | Spec. 7 | Spec. 8 |
| --- | --- | --- | --- | --- | --- | --- | --- | --- | --- |
| Sub-mount length L | (μm) | 2170 | 2170 | 2170 | 2170 | 2170 | 2170 | 2170 | 2170 |
| Sub-mount thickness H | (μm) | 140 | 200 | 240 | 340 | 400 | 540 | 240 | 240 |
| Sub-mount width W | (μm) | 600 | 600 | 600 | 600 | 600 | 600 | 400 | 800 |
| Equivalent stress | (optional) | 130 | 107 | 93 | 60 | — | 37 | 104 | 78 |
| Stress in W direction | (optional) | 1.2 | 22.4 | 30.9 | 35.1 | — | 23.9 | 29.8 | 19.3 |
| Product Σ | (optional) | 161 | 2388 | 2874 | 2095 | 1733* | 887 | 3087 | 1503 |

As shown in Spec. 1 to Spec. 6 columns, product Σ becomes maximum at a sub-mount thickness of 240 μm, and becomes smaller when the sub-mount thickness H is thicker or thinner than 240 μm. As shown in Spec. 3, Spec. 7 and Spec. 8 columns, product Σ becomes smaller when the sub-mount width is widened.

In the above-described thermal stress elasto-plastic analysis, although a rectangular parallelepiped formed of GaAs was used as the semiconductor laser chip, the similar results could be obtained from GaAs lasers of other structures. Although the package of an Fe material was used, the similar results could be obtained from a package of a Cu material. This is because the coefficient of thermal expansion of Fe ($11 \times 10^{-6}$/° C.) is close to that of Cu ($17 \times 10^{-6}$/° C.). Although AlN was used as the material for the sub-mount, the similar results could be obtained in the case of using SiC. This is because the coefficient of thermal expansion of AlN (4 to $6 \times 10^{-6}$/° C.) is close to that of SiC (4 to $5 \times 10^{-6}$/° C.). Similar results can also be obtained from commonly used nitride or InP semiconductor laser, because the material constant, which mainly governs stress, is the coefficient of thermal expansion, and the coefficient of thermal expansion of GaN ($5.6 \times 10^{-6}$/° C.) is close to that of InP ($4.5 \times 10^{-6}$/° C.).

Next, Table 2 shows the results of measuring the polarizing angles of the CD laser and the DVD laser of the two-wavelength laser according to the first embodiment by changing sub-mount thicknesses H. Here, the size of the semiconductor laser chip is 2150 µm L×240 µm W×100 µm H. However, the thickness of the semiconductor laser chip fluctuates by about ±10 µm due to the fluctuation of manufacturing conditions. It is known from Table 2 that the polarizing angle of the CD laser becomes maximum when the sub-mount thicknesses H is 240 µm, and the polarizing angle becomes smaller when the sub-mount thicknesses H is thicker or thinner than 240 µm.

TABLE 2

| Item | Unit | Spec. A | Spec. B | Spec. C |
|---|---|---|---|---|
| Sub-mount length L | (µm) | 2120 | 2120 | 2120 |
| Sub-mount thickness H | (µm) | 200 | 240 | 400 |
| Sub-mount width W | (µm) | 750 | 750 | 750 |
| Polarization angle of CD laser (measured) | (°) | −10.0 | −12.1 | −6.1 |
| Polarization angle of DVD laser (measured) | (°) | 5.8 | 5.6 | 4.0 |

The sub-mount width W of the two-wavelength laser whose polarizing angle is measured is 750 µm, which is different from the sub-mount width of 600 µm in Spec. 1 to Spec. 6 columns of Table 1. Therefore, the values of Σ corrected to those in the case of the sub-mount width of 750 µm, the values of Σ after correction standardized by the values when the sub-mount thickness is 240 µm, and the polarizing angles of CD and DVD lasers standardized by the values when the sub-mount thickness is 240 µm are shown in Table 3. Here, correction to the sub-mount width of 750 µm was performed by obtaining Σ at the sub-mount width of 750 µm using straight line approximation from change in 2 of Spec 6 and Spec. 8, and multiplying the ratio of the sub-mount widths of 600 µm and 750 µm. The values with asterisks * are values obtained from FIG. 3. It is known from Table 3 that the absolute value of the polarizing angle of the laser becomes smaller with decrease in Σ.

TABLE 3

| Sub-mount thickness H | (µm) | 140 | 200 | 240 | 340 | 400 | 540 |
|---|---|---|---|---|---|---|---|
| Corrected Σ | (optional) | 104 | 1534 | 1846 | 1346 | 1113 | 570 |
| Standardized Σ | (%) | 6 | 83 | 100 | 73 | 60* | 31 |
| Standardized polarization angle of CD laser | (%) | — | 83 | 100 | — | 50 | — |
| Standardized polarization angle of DVD laser | (%) | — | 104 | 100 | — | 71 | — |

Figure 3:
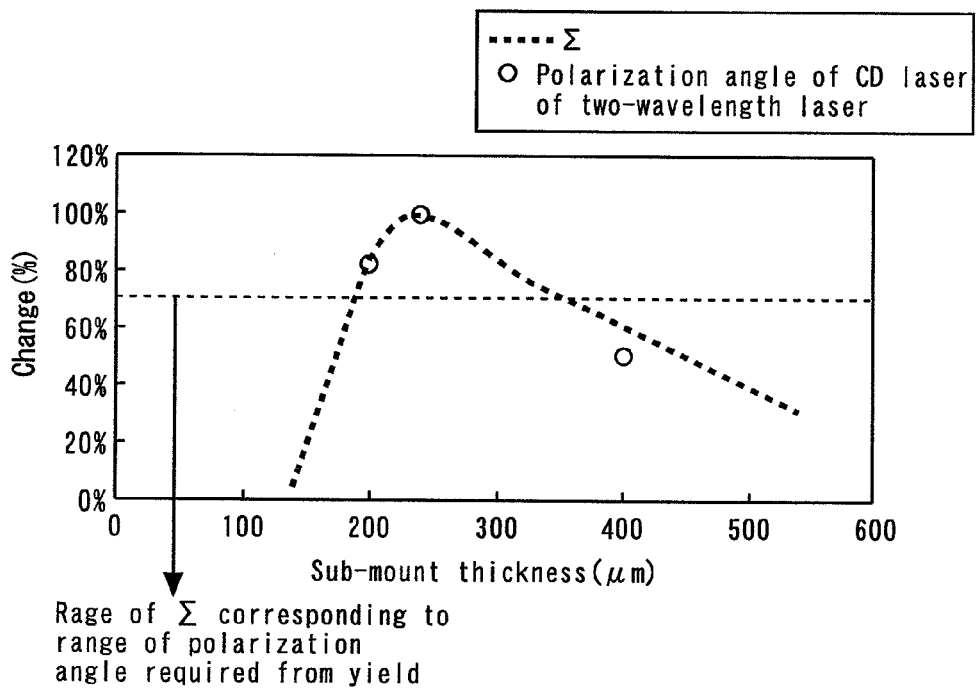
FIG. 3 is a graph wherein change in standardized polarizing angle and standardized Σ in the CD laser of a two-wavelength laser according to the first embodiment are plotted relative to sub-mount thicknesses.
Figure 4:
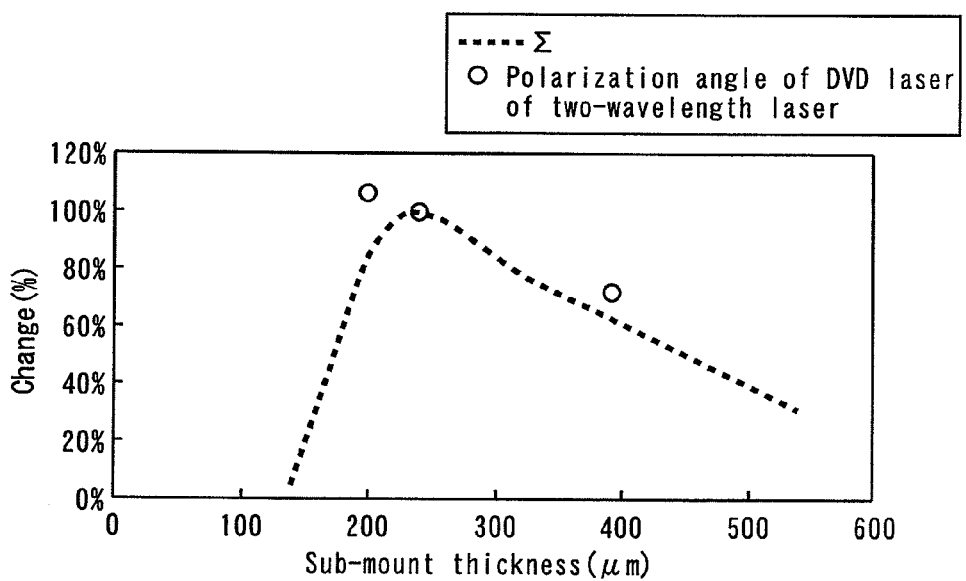
FIG. 4 is a graph wherein change in standardized polarizing angle and standardized Σ in the DVD laser of a two-wavelength laser according to the first embodiment are plotted relative to sub-mount thicknesses.

FIG. 3 is a graph wherein change in standardized polarizing angle and standardized Σ in the CD laser of a two-wavelength laser according to the first embodiment are plotted relative to sub-mount thicknesses. FIG. 4 is a graph wherein change in standardized polarizing angle and standardized Σ in the DVD laser of a two-wavelength laser according to the first embodiment are plotted relative to sub-mount thicknesses. In both lasers, it is known that changes in standardized Σ and standardized polarizing angle relative to sub-mount thicknesses are substantially agreed. Although the agreement of change in standardized polarizing angle with change in standardized Σ in the DVD laser is slightly poor, change in polarizing angles estimated from change in Σ that will be shown in Table 4 is as small as 1° or less; therefore, this difference is considered to be within the range of polarizing angle distribution.

Next, based on the polarizing angle at the sub-mount thickness of 240 µm, polarizing angles calculated using the following equation (2) and measured polarizing angles will be shown in Table 4.

$$PA(d) = PA0 \times I \quad (2)$$

where PA (d) is the polarizing angle at the sub-mount thickness of d am, PA0 is the polarizing angle at the sub-mount thickness of 240 µm, and I is Σ of the standardized sub-mount thickness of d µm. It is known from Table 4 that the polarizing angle of the laser depends on the value Σ.

TABLE 4

| Sub-mount thickness H | (µm) | 140 | 200 | 240 | 340 | 400 | 540 |
|---|---|---|---|---|---|---|---|
| Standardized Σ | (%) | 6 | 83 | 100 | 73 | 60 | 31 |
| Polarization angle of CD laser (calculated) | (°) | −0.7 | −10.1 | −12.1 | −8.8 | −7.3 | −3.7 |
| Polarization angle of DVD laser (calculated) | (°) | 0.3 | 4.7 | 5.6 | 4.1 | 3.4 | 1.7 |
| Polarization angle of CD laser (measured) | (°) | — | −10.0 | −12.1 | — | −6.1 | — |
| Polarization angle of DVD laser (measured) | (°) | — | 5.8 | 5.6 | — | 4.0 | — |

Figure 5:
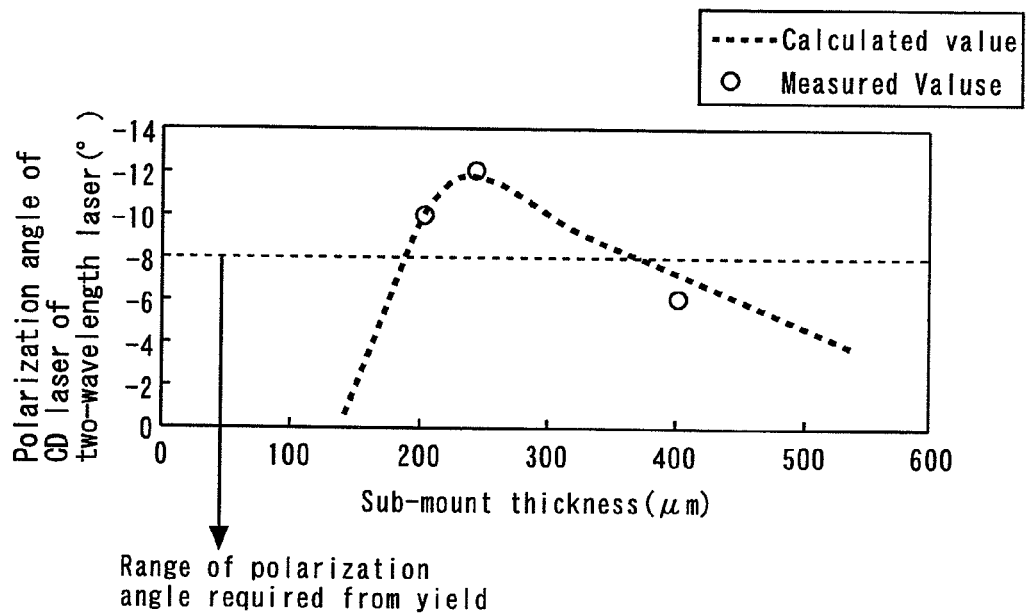
FIG. 5 is a graph wherein polarizing angles in the CD laser of a two-wavelength laser according to the first embodiment are plotted relative to sub-mount thicknesses.
Figure 6:
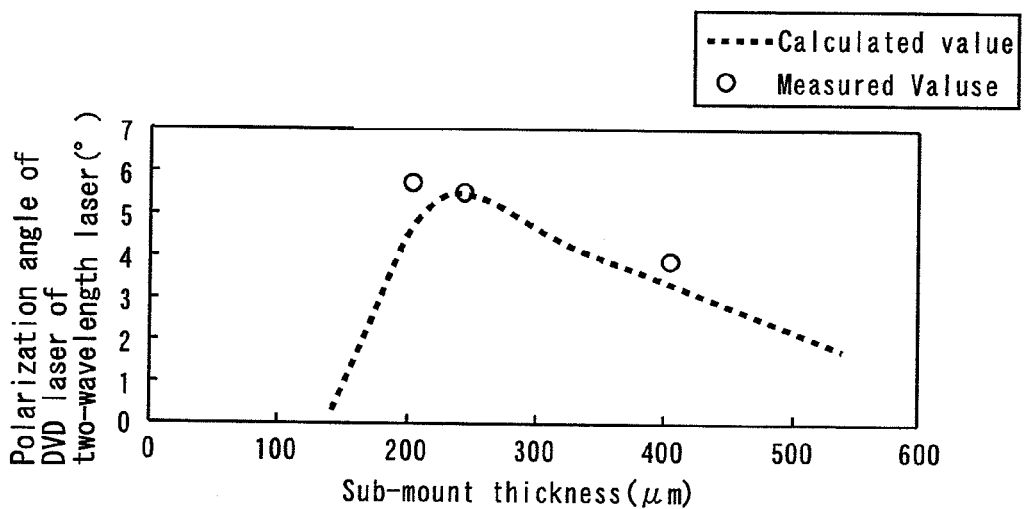
FIG. 6 is a graph wherein polarizing angles in the DVD laser of a two-wavelength laser according to the first embodiment are plotted relative to sub-mount thicknesses.

FIG. 5 is a graph wherein polarizing angles in the CD laser of a two-wavelength laser according to the first embodiment are plotted relative to sub-mount thicknesses. FIG. 6 is a graph wherein polarizing angles in the DVD laser of a two-wavelength laser according to the first embodiment are plotted relative to sub-mount thicknesses. It is known that the polarizing angle of the CD laser is within −10° at a sub-mount thickness of 200 µm or less, within −8° at 350 µm or more, and within −4° at 160 µm or less and 520 µm or more. It is also known that the polarizing angle of the DVD laser is within 4° at a sub-mount thickness of 190 µm or less and 350 µm or more, and 2° or less at 160 µm or less and 520 µm or more.

From the viewpoint of yield, the polarizing angles of both CD laser and DVD laser are required to be within the range between −8° and +8°. Therefore, sub-mount thickness H must be 350 µm or more, or 190 µm or less. When FIG. 3 and FIG. 5 are compared, the range of the sub-mount thickness H is the range wherein the product Σ is 70% or less of the maximum value obtained by changing the thickness H and width W of the sub-mount.

In the first embodiment, therefore, the thickness H of the AlN sub-mount is determined so that the product Σ becomes 70% or less of the maximum value of the value Σ obtained by changing the thickness H of the AlN sub-mount. Specifically, the thickness H of the AlN sub-mount is made to be 350 µm or more, or 190 µm or less. Thereby, the polarizing angle of the laser can be reduced to −8° to +8°.

Second Embodiment

Figure 7:
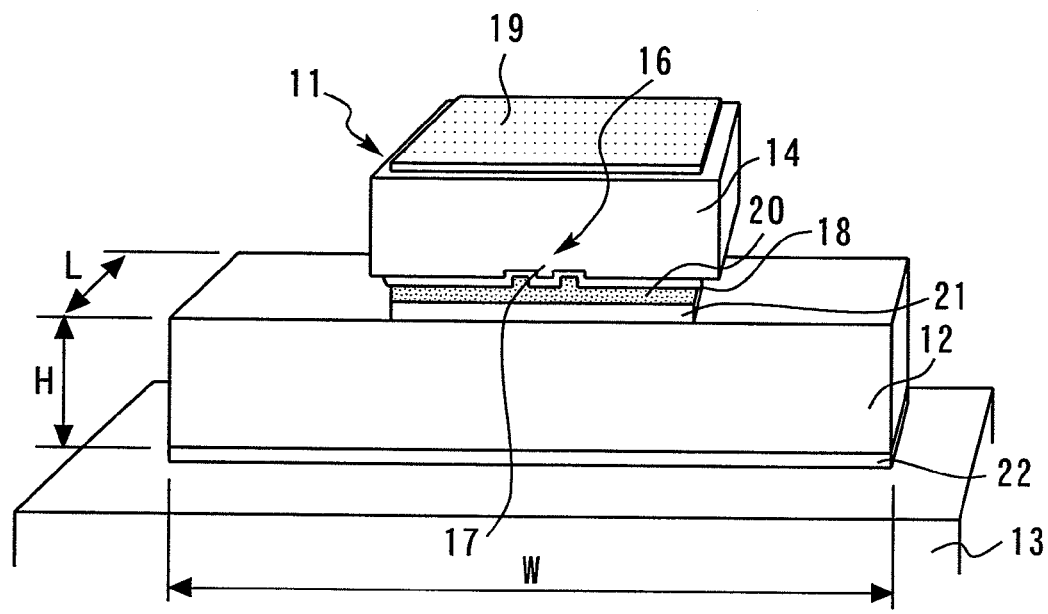
FIG. 7 is a perspective view showing joining portions of the semiconductor laser chip and the sub-mount in the semiconductor light emitting device according to the second embodiment.

FIG. 7 is a perspective view showing joining portions of the semiconductor laser chip and the sub-mount in the semiconductor light emitting device according to the second embodiment. The semiconductor laser chip 11 is a single DVD laser 16 formed on a GaAs substrate 14. In the same manner as in the first embodiment, thickness H of the AlN sub-mount 12 is adjusted to reduce the polarizing angle of the laser. A method for the adjustment will be described below in detail.

First, the results of measuring the polarizing angles of a single DVD laser according to the second embodiment by changing the sub-mount thicknesses H. The size of the semiconductor laser chip 11 is 2200 μm L×180 μm W×100 μm H. However, the thickness of the semiconductor laser chip 11 fluctuates by about ±10 μm due to the fluctuation of manufacturing conditions.

TABLE 5

| Item | Unit | Spec. A | Spec. B | Spec. C |
|---|---|---|---|---|
| Sub-mount length L | (μm) | 2170 | 2170 | 2170 |
| Sub-mount thickness H | (μm) | 200 | 240 | 400 |
| Sub-mount width W | (μm) | 600 | 600 | 600 |
| Polarization angle (measured) | (°) | −1.7 | −1.9 | −0.3 |

Next, the value wherein Σ is standardized using the value of a sub-mount thickness of 240 μm, and the polarizing angle calculated based on the polarizing angle at the sub-mount thickness of 240 μm using the equation (2) will be shown in Table 6.

TABLE 6

| Sub-mount thickness H | (μm) | 140 | 200 | 240 | 340 | 400 | 540 |
|---|---|---|---|---|---|---|---|
| Standardized Σ | (%) | 6 | 83 | 100 | 73 | 60 | 31 |
| Polarization angle (calculated) | (°) | −0.1 | −1.6 | −1.9 | −1.4 | −1.1 | −0.6 |
| Polarization angle (measured) | (°) | — | −1.7 | −1.9 | — | −0.3 | — |

Figure 8:
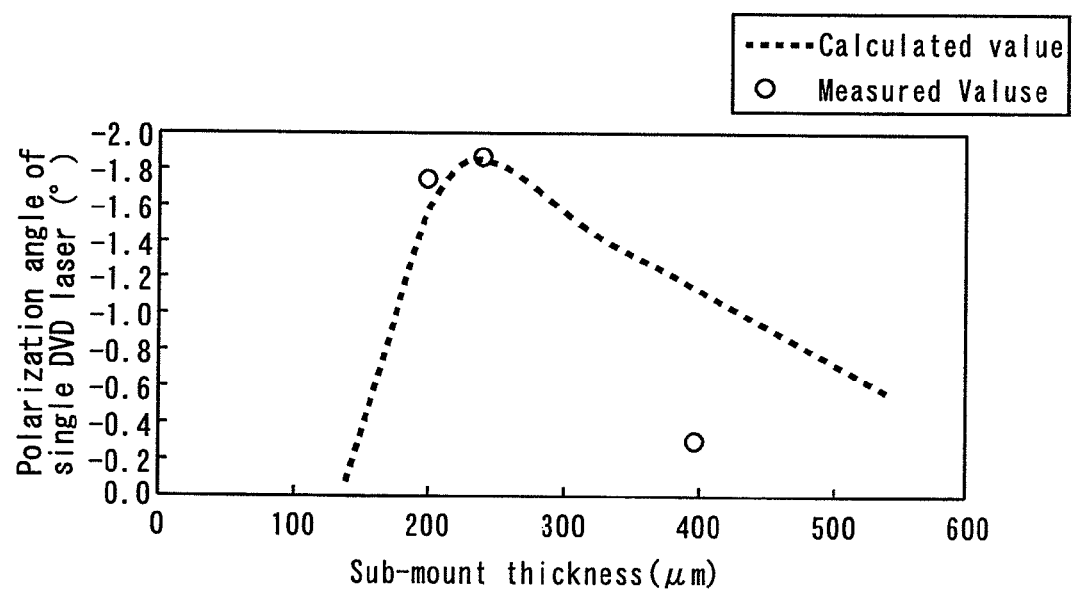
FIG. 8 is a graph wherein the polarizing angles of a single DVD laser of a two-wavelength laser according to the second embodiment are plotted relative to sub-mount thicknesses.

FIG. 8 is a graph wherein the polarizing angles of a single DVD laser of a two-wavelength laser according to the second embodiment are plotted relative to sub-mount thicknesses. The polarizing angles of the single DVD laser are originally small, and change in polarizing angles associated with change in the thickness H of the sub-mount is as small as −1° or less. Therefore, due to the effect of fluctuation in characteristics, the calculated polarizing angle does not agree with the measured value when the sub-mount thickness is 400 μm. However, the tendency of change in polarizing angles is the same. Therefore, as in the first embodiment, the polarizing angles of the laser also depend on the product Σ and the sub-mount thickness H.

In the second embodiment, therefore, as in the first embodiment, the thickness H of the AlN sub-mount is determined so that the product Σ becomes 70% or less of the maximum value of the value Σ obtained by changing the thickness H of the AlN sub-mount. Specifically, the thickness H of the AlN sub-mount is made to be 350 μm or more, or 190 μm or less. Thereby, the polarizing angle of the laser can be reduced.

Third Embodiment

In the third embodiment, the semiconductor laser chip is a single DVD laser as in the second embodiment. However, although the polarizing angle is reduced by adjusting the sub-mount thickness H in the second embodiment, the polarizing angle is reduced by adjusting the sub-mount width W in the third embodiment. A method for the adjustment will be described below in detail.

First, the results of measuring the polarizing angles of a single DVD laser according to the third embodiment by changing the sub-mount width W, and measured polarizing angles. The size of the semiconductor laser chip 11 is 2200 μm L×180 μm W×100 μm H. However, the thickness of the semiconductor laser chip fluctuates by about −10 μm due to the fluctuation of manufacturing conditions.

TABLE 7

| Item | Unit | Spec. D | Spec. E |
|---|---|---|---|
| Sub-mount length L | (μm) | 2170 | 2170 |
| Sub-mount thickness H | (μm) | 240 | 240 |
| Sub-mount width W | (μm) | 600 | 800 |
| Polarization angle (measured) | (°) | −1.9 | −0.3 |

Next, based on the value of Σ standardized by the sub-mount width of 600 μm, and the polarizing angle at the sub-mount width of 600 μm, polarizing angles calculated using the following equation (3) and measured polarizing angles will be shown in Table 8.

$$PA(w) = PA0 \times I \quad (3)$$

where PA (w) is the polarizing angle at the sub-mount width of W μm, PA0 is the polarizing angle at the sub-mount width of 600 μm, and I is Σ of the standardized sub-mount width of W μm. The value with asterisk * in Table 8 is the value obtained from FIG. 9.

TABLE 8

| Sub-mount width W | (μm) | 400 | 600 | 800 | 950 |
|---|---|---|---|---|---|
| S | (optional) | 3087 | 2874 | 1503 | 476 |
| Standardized Σ | (%) | 107 | 100 | 52 | 17* |
| Polarization angle (calculated) | (°) | −2.0 | −1.9 | −1.0 | −0.3 |
| Polarization angle (measured) | (°) | — | −1.87 | −0.29 | — |

Figure 9:
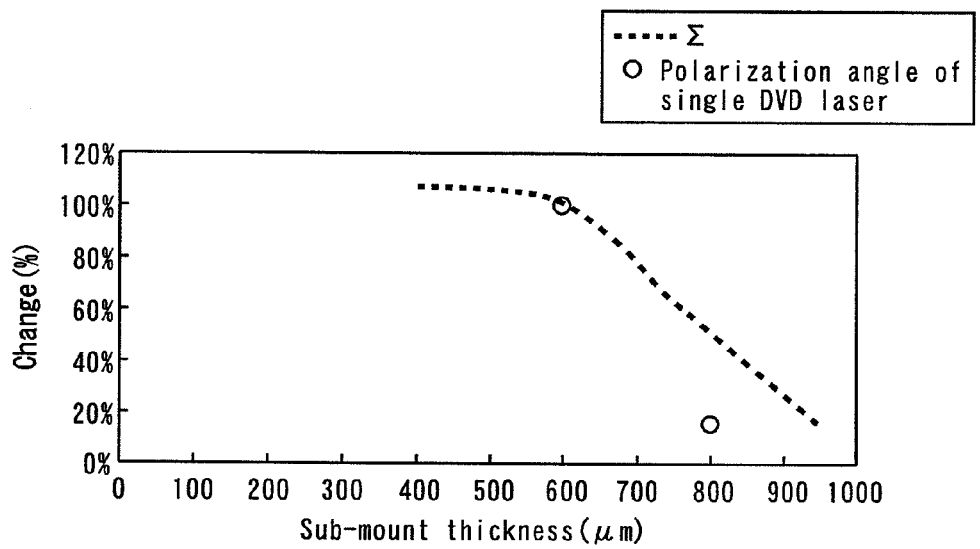
FIG. 9 is a graph wherein change in standardized polarizing angles and the standardized E of a single DVD laser of a two-wavelength laser according to the third embodiment are plotted relative to sub-mount thicknesses.
Figure 10:
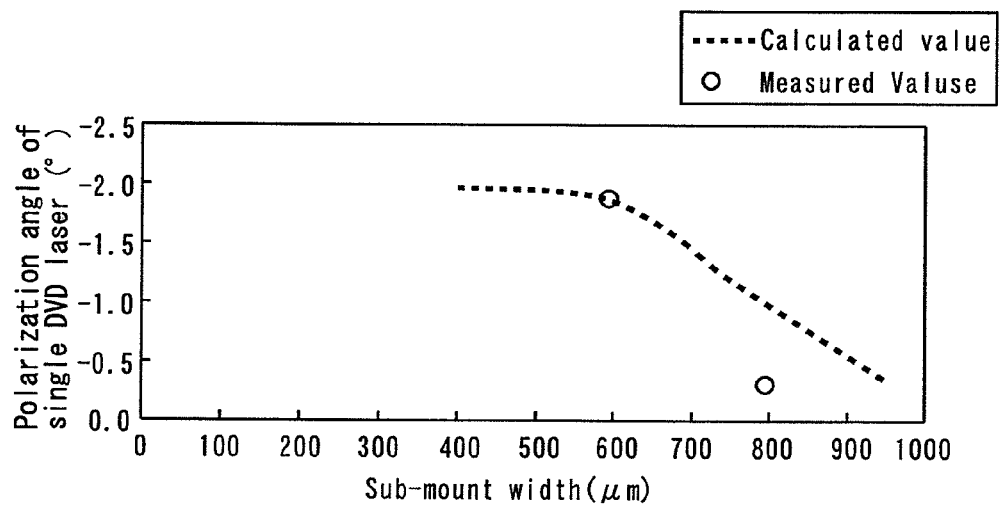
FIG. 10 is a graph wherein the polarizing angles of a single DVD laser according to the third embodiment are plotted relative to sub-mount thicknesses.

FIG. 9 is a graph wherein change in standardized polarizing angles and the standardized Σ of a single DVD laser of a two-wavelength laser according to the third embodiment are plotted relative to sub-mount thicknesses. FIG. 10 is a graph wherein the polarizing angles of a single DVD laser according to the third embodiment are plotted relative to sub-mount thicknesses. The polarizing angles of the single DVD laser are originally small, and change in polarizing angles associated with change in the widths W of the sub-mount is as small as −1° or less. Therefore, due to the effect of fluctuation in characteristics, the calculated polarizing angle does not agree with the measured value when the sub-mount width is 800 μm. However, the tendency of change in polarizing angles is the same. Therefore, as in the first embodiment, the polarizing angles of the laser also depend on the product Σ and the sub-mount width W. It is known that the polarizing angle becomes substantially 0° when the sub-mount width is 950 μm or more.

In the third embodiment, therefore, the width W of the AlN sub-mount 12 is determined so that the product Σ becomes 17% or less of the maximum value of the value Σ obtained by changing the width W of the AlN sub-mount 12. Specifically, the width W of the AlN sub-mount 12 is made to be 950 μm or more. Thereby, the polarizing angle of the laser can be reduced to substantially 0°.

Fourth Embodiment

In the fourth embodiment, the semiconductor laser chip is a two-wavelength laser as in the first embodiment. However, although the polarizing angle is reduced by adjusting the sub-mount thickness H in the first embodiment, the polarizing angle is reduced by adjusting the sub-mount width W in the fourth embodiment. A method for the adjustment will be described below in detail.

First, the sub-mount widths W, the values of Σ standardized by the value of the sub-mount width of 600 μm, and the polarizing angles of the CD laser and the DVD laser of the two-wavelength laser are shown in Table 9. Here, only the polarizing angle at the sub-mount width of 750 μm is the measured value, and the polarizing angles at the sub-mount widths of 600 μm, 800 μm and 950 μm are values calculated from change in Σ using the equation (3) in the same manner as in the third embodiment. The size of the semiconductor laser chip 11 is 2150 μm L×240 μm W×100 μm H. However, the thickness of the semiconductor laser chip fluctuates by about ±10 μm due to the fluctuation of manufacturing conditions. The sizes of the AlN sub-mounts are 2120 μm L×240 μm H, and the widths W are 600 μm, 750 μm, 800 μm and 950 μm. The values with asterisks * in Table 9 are the values obtained from FIG. 10. It is known from Table 9 that the polarizing angles of both the CD laser and the DVD laser become smaller by widening the sub-mount width W.

TABLE 9

| Sub-mount width W | (μm) | 600 | 750 | 800 | 950 |
|---|---|---|---|---|---|
| S | (optional) | 2874 | 1846* | 1503 | 476* |
| Standardized Σ | (%) | 100 | 64 | 52 | 17* |
| Polarization angle of CD laser (calculated) | (°) | −18.8 | −12.1 | −9.9 | −3.1 |
| Polarization angle of DVD laser (calculated) | (°) | 8.7 | 5.6 | 4.6 | 1.4 |

In the fourth embodiment, therefore, the width W of the AlN sub-mount 12 is determined so that the product Σ becomes 17% or less of the maximum value of the value Σ obtained by changing the width W of the AlN sub-mount 12. Specifically, the width W of the AlN sub-mount 12 is made to be 950 μm or more. Thereby, the polarizing angle of the laser can be reduced to about −3° to +3°.

Fifth Embodiment

Figure 11:
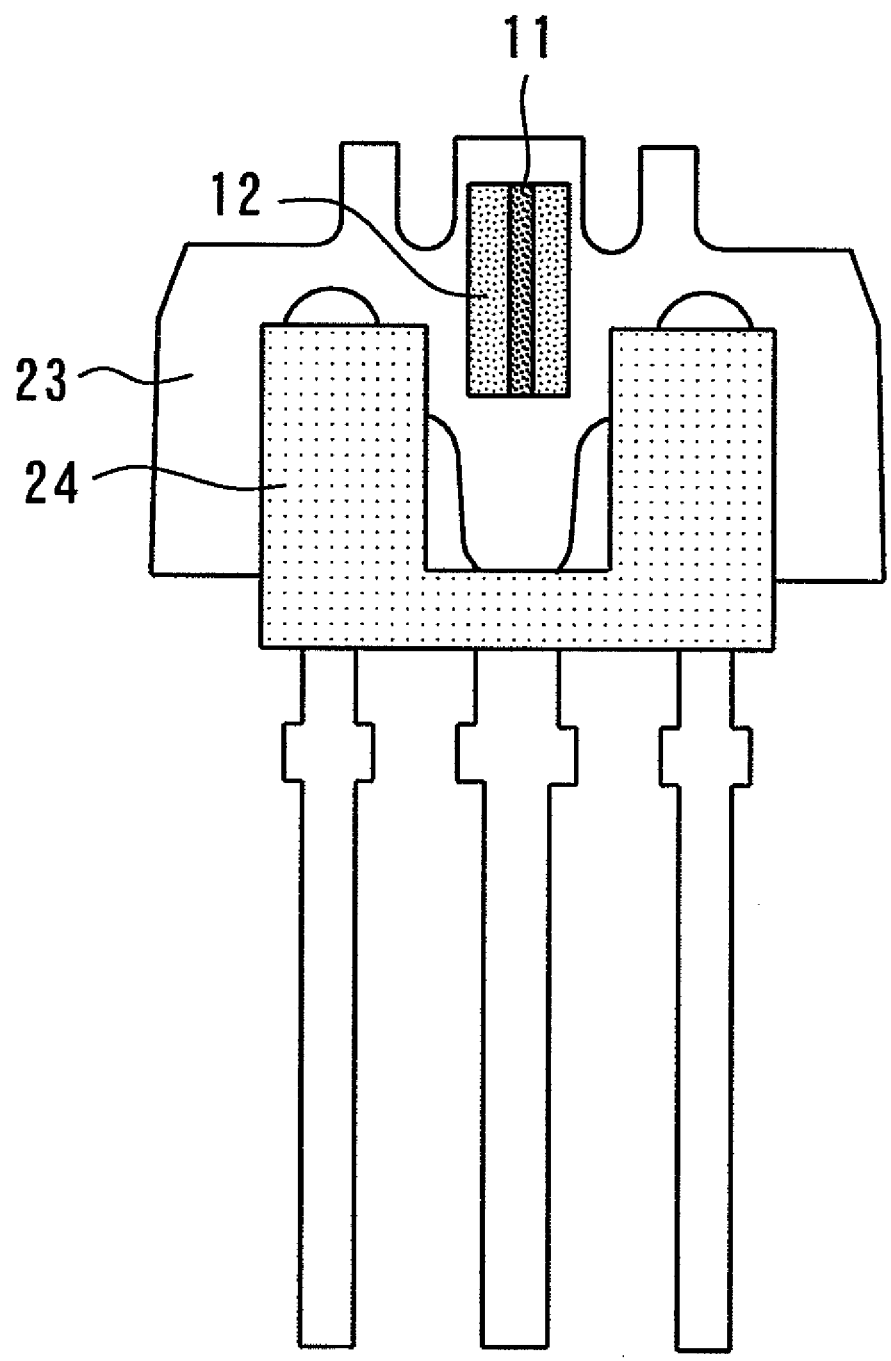
FIG. 11 is a plan view showing a semiconductor light emitting device according to the fifth embodiment.

FIG. 11 is a plan view showing a semiconductor light emitting device according to the fifth embodiment. The semiconductor light emitting device is a frame package wherein a semiconductor laser chip 11 is joined on an AlN sub-mount 12 in a junction-down manner, the AlN sub-mount 12 is joined to a Cu frame 23 (package), and a part of the Cu frame 23 is encapsulated with a mold resin 24. The semiconductor laser chip 11 is a two-wavelength laser as in the first embodiment.

In the fifth embodiment, the polarizing angle of the laser is reduced by adjusting the thickness H of the AlN sub-mount 12 in the same manner as in the first embodiment. A method for the adjustment will be described below in detail.

First, the size of the sub-mount and the polarizing angles of the CD laser and DVD laser in the two-wavelength laser are shown in FIG. 10. Here, the size of the semiconductor laser chip 11 is 2170 pin L×240 μm W×100 μm H. However, the thickness of the semiconductor laser chip 11 fluctuates by about ±10 μm due to the fluctuation of manufacturing conditions. The size of the AlN sub-mount is 2120 μm L×750 μm W. The thicknesses are 240 μm and 400 μm.

TABLE 10

| Item | Unit | Spec. A | Spec. B | Spec. C |
|---|---|---|---|---|
| Sub-mount length L | (μm) | 2120 | 2120 | 2120 |
| Sub-mount thickness H | (μm) | 200 | 240 | 400 |
| Sub-mount width W | (μm) | 750 | 750 | 750 |
| Polarization angle of CD laser | (°) | — | −7.6 | −6.4 |
| Polarization angle of DVD laser | (°) | — | −4.2 | −4.1 |

Next, the values of Σ standardized by the value of the sub-mount width of 240 μm, the polarizing angles calculated using the equation (2) based on the polarizing angle at the sub-mount thickness of 240 μm, and measured polarizing angles are shown in Table 11. It is known from Tables 10 and 11 that the product Σ is reduced when the sub-mount thickness H is thickened or thinned than 240 μm.

TABLE 11

| Sub-mount thickness H | (μm) | 140 | 200 | 240 | 340 | 400 | 540 |
|---|---|---|---|---|---|---|---|
| Standardized Σ | (%) | 6 | 83 | 100 | 73 | 60 | 31 |
| Polarization angle of CD laser (calculated) | (°) | −0.4 | −6.3 | −7.6 | −5.5 | −4.6 | −2.3 |
| Polarization angle of DVD laser (calculated) | (°) | −0.2 | −3.5 | −4.2 | −3.1 | −2.6 | −1.3 |
| Polarization angle of CD laser (measured) | (°) | — | — | −7.6 | — | −6.4 | — |
| Polarization angle of DVD laser (measured) | (°) | — | — | −4.2 | — | −4.1 | — |

Figure 12:
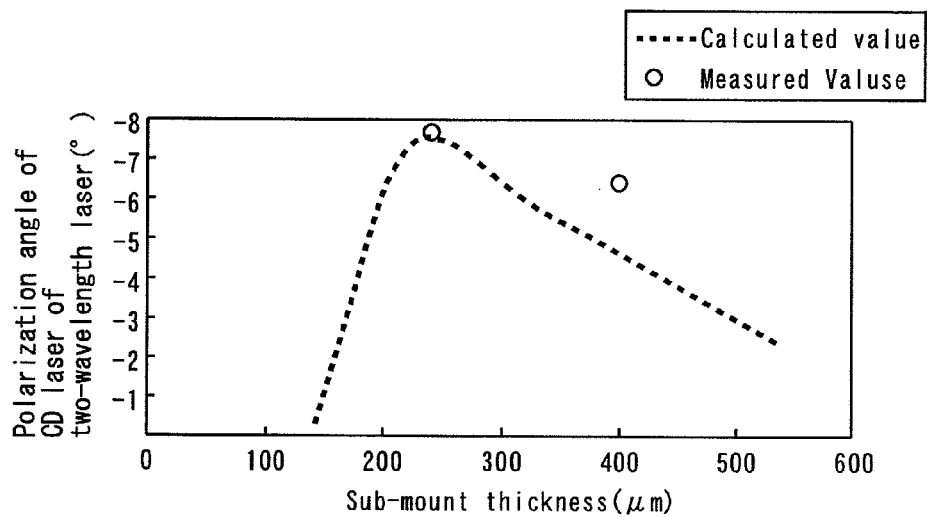
FIG. 12 is a graph wherein polarizing angles in the CD laser of a two-wavelength laser according to the fifth embodiment are plotted relative to sub-mount thicknesses.
Figure 13:
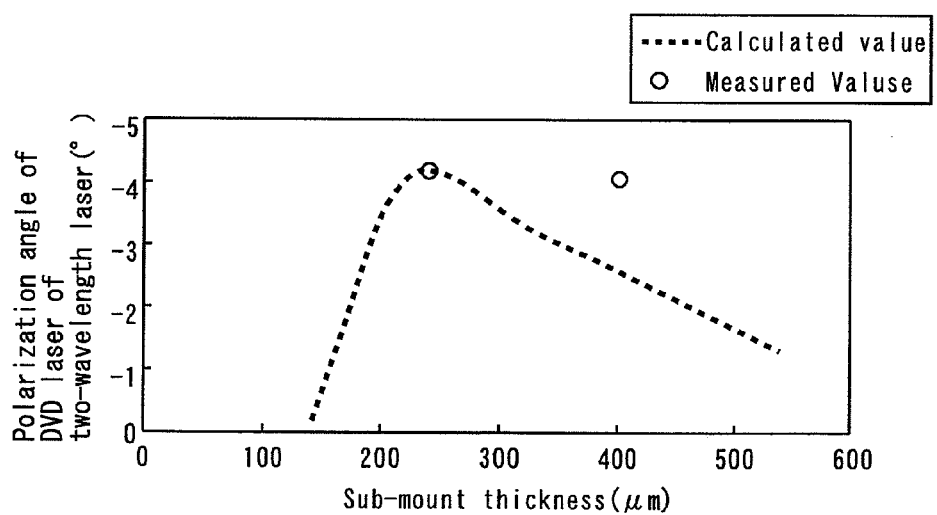
FIG. 13 is a graph wherein polarizing angles in the DVD laser of a two-wavelength laser according to the fifth embodiment are plotted relative to sub-mount thicknesses.

FIG. 12 is a graph wherein polarizing angles in the CD laser of a two-wavelength laser according to the fifth embodiment are plotted relative to sub-mount thicknesses. FIG. 13 is a graph wherein polarizing angles in the DVD laser of a two-wavelength laser according to the fifth embodiment are plotted relative to sub-mount thicknesses. The tendency of change in measured polarizing angles is same as the tendency of change in polarizing angles obtained using calculation. It is known from Table 11 and FIGS. 12 and 13 that the polarizing angle can be reduced by adjusting the sub-mount thickness H in the same manner as in the first embodiment.

In the fifth embodiment, therefore, the thickness H of the AlN sub-mount 12 is determined so that the product Σ becomes 70% or less of the maximum value of the value Σ obtained by changing the thickness H of the AlN sub-mount 12 in the same manner as in the first embodiment. Specifically, the thickness H of the AlN sub-mount 12 is made to be 350 μm or more, or 190 μm or less. Thereby, the polarizing angle of the laser can be reduced.

Although one of the thickness and the width of the sub-mount is determined in the above-described embodiments, the present invention is not limited thereto, but both the thickness and width of a sub-mount may be determined so that the product Σ becomes 70% or less or 17% or less of the maximum value of the product Σ obtained by changing the thickness and the width of the sub-mount, respectively.

Alternatively, the thickness of the sub-mount may be determined so that the product Σ becomes 70% or less of the maximum value of the product Σ obtained by changing the thickness of the sub-mount, and the product Σ becomes 17% or less of the maximum value of the product Σ obtained by changing the width of the sub-mount.

In order to prevent that the position of the light-emitting point is changed before and after the thickness of the sub-mount is changed, the shape of the package, such as the stem, block and frame of the sub-mount, may be adjusted.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-304803, filed on Nov. 26, 2007 including specification, claims, drawings and summary, on which the Convention priority of the present application is based, are incorporated herein by reference in its entirety.

What is claimed is:

1. A semiconductor light emitting device comprising:
    a sub-mount having a width and a thickness,
    a semiconductor laser chip joined to said sub-mount in a junction-down manner at a surface of said semiconductor chip, and
    a package joined to said sub-mount, wherein
        a first direction perpendicular to the direction of irradiation of a laser beam emitted from said semiconductor laser chip is a width direction of said sub-mount, and
        the thickness of said sub-mount is determined so that the product of (i) an equivalent stress applied to the center of the surface of said semiconductor laser chip joined to said sub-mount and (ii) stress in the width direction of said sub-mount, does not exceed 70% of a maximum value of the product obtained by changing the thickness and the width of said sub-mount.

2. The semiconductor light emitting device according to claim 1, wherein the width of said sub-mount is determined so that the product does not exceed 17% of the maximum value of the product obtained by changing the thickness and the width of said sub-mount.

3. The semiconductor light emitting device according to claim 1, wherein said sub-mount is AlN, and has a width in a range from 600 µm to 750 µm, and a thickness in one of a first range and a second range, the first range being a thickness of at least 350 µm and the second range being a thickness no larger than 190 µm.

4. The semiconductor light emitting device according to claim 2, wherein said sub-mount is AlN, and has a width of at least 950 µm, and a thickness of about 240 µm.

5. The semiconductor light emitting device according to claim 1, wherein said semiconductor laser chip includes a plurality of monolithically integrated semiconductor lasers having different wavelengths.

6. A method for manufacturing a semiconductor light emitting device including:
    joining a semiconductor laser chip to a sub-mount in a junction-down manner, and
    joining said sub-mount to a package, wherein
        a first direction perpendicular to the direction of irradiation of a laser beam emitted from said semiconductor laser chip is a width direction of said sub-mount, and
        determining the product of (i) an equivalent stress applied to the center of the surface of said semiconductor laser chip joined to said sub-mount and (ii) stress in the width direction of said sub-mount as the width and thickness are varied, and choosing the thickness of said sub-mount so that the product does not exceed 70% of a maximum value of the product obtained by changing the thickness and the width of said sub-mount.

7. The method for manufacturing a semiconductor light emitting device according to claim 6, including determining the width of said sub-mount so that the product does not exceed 17% of the maximum value of the product obtained by changing the thickness and the width of said sub-mount.

* * * * *